United States Patent
Minami et al.

(10) Patent No.: US 9,346,977 B2
(45) Date of Patent: May 24, 2016

(54) ABRASIVE, ABRASIVE SET, AND METHOD FOR ABRADING SUBSTRATE

(71) Applicant: HITACHI CHEMICAL COMPANY, LTD., Tokyo (JP)

(72) Inventors: Hisataka Minami, Hitachi (JP); Toshiaki Akutsu, Hitachi (JP); Tomohiro Iwano, Hitachi (JP); Koji Fujisaki, Kokubunji (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/379,947

(22) PCT Filed: Feb. 14, 2013

(86) PCT No.: PCT/JP2013/053558
§ 371 (c)(1),
(2) Date: Aug. 20, 2014

(87) PCT Pub. No.: WO2013/125445
PCT Pub. Date: Aug. 29, 2013

(65) Prior Publication Data
US 2015/0024596 A1  Jan. 22, 2015

(30) Foreign Application Priority Data
Feb. 21, 2012 (JP) .................... 2012-035439

(51) Int. Cl.
*C09K 13/00* (2006.01)
*C09G 1/02* (2006.01)
*H01L 21/3105* (2006.01)
(Continued)

(52) U.S. Cl.
CPC ............... *C09G 1/02* (2013.01); *C09K 3/1409* (2013.01); *C09K 3/1436* (2013.01); *C09K 3/1463* (2013.01); *H01L 21/30625* (2013.01); *H01L 21/31053* (2013.01); *H01L 21/76224* (2013.01)

(58) Field of Classification Search
CPC ...... B24B 37/044; C09G 1/02; C09K 3/1463; H01L 21/30625; H01L 21/31053
USPC ....... 252/79.1; 438/692, 693; 451/28; 51/309
See application file for complete search history.

(56) References Cited

U.S. PATENT DOCUMENTS 7,563,383 B2 * 7/2009 de Rege Thesauro ... C09G 1/02
                                                                    216/88
8,075,800 B2 * 12/2011 Koyama et al. ............... 252/79.1
(Continued)

FOREIGN PATENT DOCUMENTS

JP       8-22970     1/1996
JP       10-106994   4/1998
(Continued)

OTHER PUBLICATIONS

Communication mailed May 21, 2013, in connection with PCT/JP2013/053558, 2 pages.
Communication mailed Sep. 4, 2014, in connection with PCT/JP2013/053558, 7 pages.

*Primary Examiner* — Nadine Norton
*Assistant Examiner* — Christopher Remavege
(74) *Attorney, Agent, or Firm* — Fitch, Even, Tabin and Flannery LLP

(57) ABSTRACT

The polishing agent of the invention comprises water, an abrasive grain containing a hydroxide of a tetravalent metal element, and a specific glycerin compound.

13 Claims, 2 Drawing Sheets

(51) Int. Cl.
*C09K 3/14* (2006.01)
*H01L 21/306* (2006.01)
*H01L 21/762* (2006.01)

(56) References Cited

U.S. PATENT DOCUMENTS

| | | | |
|---|---|---|---|
| 2004/0065022 A1* | 4/2004 | Machii et al. ................. 51/309 |
| 2004/0084414 A1* | 5/2004 | Sakai ..................... C09G 1/02 |
| | | | 216/88 |
| 2007/0176140 A1* | 8/2007 | Matsuda ................. C09G 1/02 |
| | | | 252/79.1 |
| 2009/0104778 A1* | 4/2009 | Sakanishi et al. ............ 438/692 |
| 2011/0039475 A1* | 2/2011 | Hoshi et al. ..................... 451/28 |
| 2012/0108064 A1* | 5/2012 | Suzuki et al. ................. 438/689 |
| 2012/0282775 A1* | 11/2012 | Kim ..................... C09K 3/1409 |
| | | | 438/693 |

FOREIGN PATENT DOCUMENTS

| | | |
|---|---|---|
| JP | 2005-175432 | 6/2005 |
| JP | 2006-249129 | 9/2006 |
| JP | 2008-91524 | 4/2008 |
| JP | 2009-212378 | 9/2009 |
| WO | WO 02/067309 | 8/2002 |
| WO | WO 2009/131133 | 10/2009 |

* cited by examiner

ABRASIVE, ABRASIVE SET, AND METHOD FOR ABRADING SUBSTRATE

TECHNICAL FIELD

The present invention relates to a polishing agent, a polishing agent set and a polishing method for a base substrate using the polishing agent or the polishing agent set. In particular, the invention relates to a polishing agent and polishing agent set to be used in a flattening step of a base substrate surface as a production technique for a semiconductor element, and to a polishing method for a base substrate using the polishing agent or the polishing agent set. More specifically, the invention relates to a polishing agent and polishing agent set to be used in a flattening step for a Shallow Trench Isolation (hereunder, "STI") insulating material, a pre-metal insulating material or an interlayer insulating material, and to a polishing method for a base substrate using the polishing agent or the polishing agent set.

BACKGROUND ART

In recent years, processing techniques for increasing density and micronization are becoming ever more important in manufacturing steps for semiconductor elements. One such machining technique, CMP (chemical mechanical polishing) technique, has become an essential technique in manufacturing steps for semiconductor elements, for STI formation, flattening of pre-metal insulating materials or interlayer insulating materials, and formation of plugs or embedded metal wirings, and the like.

Most commonly used as CMP polishing agents are silica-based CMP polishing agents containing silica (silicon oxide) particles such as fumed silica and colloidal silica as abrasive grains. Silica-based CMP polishing agents have a feature of high flexibility of use, and appropriate selection of the abrasive grain content, pH and additives allows polishing of a wide variety of materials regardless of the insulating material or the conductive material.

Demand is also increasing for CMP polishing agents comprising cerium compound particles as abrasive grains, mainly designed for polishing of insulating materials such as silicon oxide. For example, cerium oxide-based CMP polishing agents comprising cerium oxide (ceria) particles as abrasive grains allow the polishing of silicon oxide at high rate, with even lower abrasive grain contents than silica-based CMP polishing agents (see Patent Literatures 1 and 2, for example).

Addition of various organic compounds to polishing agents is known for adjusting the polishing properties of polishing agents. For example, addition of surfactants to cerium oxide-based CMP polishing agents is known. As such techniques, the polishing agent comprising a nonionic surfactant having HLB value of 17.5 or greater (such as polyoxypropylene glyceryl ether) is known (see Patent Literature 3, for example).

Recently, as demand increases for achieving greater micronization of wirings in manufacturing steps for semiconductor elements, generation of polishing scratches during polishing are becoming problematic. Specifically, even when fine polishing scratches generates during the polishing using conventional cerium oxide-based polishing agents, it was not problematic so long as the sizes of the polishing scratches are smaller than conventional wiring widths, but it can be problematic even when the polishing scratches are fine for achieving further greater micronization of wirings.

A solution to this problem is being sought through studying polishing agents that employ particles of hydroxides of a tetravalent metal element (see Patent Literature 4, for example). Methods for producing particles of hydroxides of a tetravalent metal element are also being studied (see Patent Literature 5, for example). Such techniques are aimed at reducing particle-induced polishing scratches, by maintaining the chemical action of particles of the hydroxide of a tetravalent metal element while minimizing their mechanical action.

CITATION LIST

Patent Literature

[Patent Literature 1] Japanese Unexamined Patent Application Publication HEI No. 10-106994
[Patent Literature 2] Japanese Unexamined Patent Application Publication HEI No. 08-022970
[Patent Literature 3] Japanese Unexamined Patent Application Publication No. 2009-212378
[Patent Literature 4] International Patent Publication No. WO2002/067309
[Patent Literature 5] Japanese Unexamined Patent Application Publication No. 2006-249129

Non-Patent Literature

[Non-Patent Literature 1] Complete Works of Dispersion Technology, Johokiko Co., Ltd., July, 2005, Chapter 3, "Dispersers: Recent development trends and selection criteria"

SUMMARY OF INVENTION

Technical Problem

However, while the techniques described in Patent Literatures 4 and 5 reduce polishing scratches, they cannot be said to provide sufficiently high polishing rate for insulating materials. Since polishing rate affects the efficiency of the production process, polishing agents with higher polishing rates are desired.

Furthermore, in CMP steps for formation of STIs, insulating materials such as silicon oxide are polished using silicon nitride, polysilicon or the like as stopper materials (constituent materials of polish stop layers). In such cases, there is a need for a polishing agent with high polishing selectivity for insulating material with respect to stopper material (polishing rate ratio: polishing rate of insulating material/polishing rate of stopper material), in order to improve flatness and minimize erosion (overpolishing of the stopper material).

It is an object of the present invention to solve this technical problem and provide a polishing agent, a polishing agent set and a polishing method that can increase the polishing rate for insulating materials and that can also improve the polishing selectivity for insulating materials with respect to stopper materials.

Solution to Problem

In conducting research on increasing interaction between abrasive grains and insulating materials with the aim of solving the problem described above, the present inventors conceived bridging abrasive grains and insulating materials with hydrogen bonding by specific glycerin compounds, and has completed the invention.

The polishing agent according to the first embodiment of the invention comprises water, an abrasive grain containing a hydroxide of a tetravalent metal element, and a glycerin compound, the glycerin compound being at least one selected from the group consisting of compounds represented by general formula (I) below and compounds represented by general formula (II) below.

[Chemical Formula 1]

(I)

[In formula (I), m is an integer of 3 or greater.]

[Chemical Formula 2]

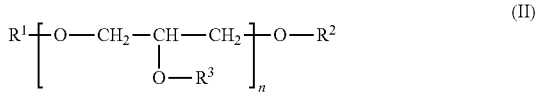

(II)

[In formula (II), n represents an integer of 2 or greater, and $R^1$, $R^2$ and the multiple $R^3$ each independently represent hydrogen atom, a group represented by general formula (III) below or a group represented by general formula (IV) below. The case where $R^1$, $R^2$ and the multiple $R^3$ are all hydrogen atom is excluded.]

[Chemical Formula 3]

(III)

[In formula (III), p represents an integer of 1 or greater.]

[Chemical Formula 4]

(IV)

[In formula (IV), q represents an integer of 1 or greater.]

With the polishing agent according to the first embodiment of the invention, it is possible to increase the polishing rate for insulating materials while also improving polishing selectivity for insulating materials with respect to stopper materials, compared to a conventional polishing agent. Also, with the polishing agent according to the first embodiment of the invention, in CMP techniques for flattening of STI insulating materials, pre-metal insulating materials, interlayer insulating materials and the like, it is possible to polish these insulating materials at high rate while also improving the polishing selectivity for insulating materials with respect to stopper materials. In addition, the polishing agent according to the first embodiment of the invention can allow the polishing of insulating materials with low polishing scratches while also increasing the polishing rate for insulating materials.

The polishing agent according to the second embodiment of the invention comprises water, an abrasive grain containing a hydroxide of a tetravalent metal element, and a glycerin compound, the glycerin compound being at least one selected from the group consisting of polyglycerin, diglycerin derivatives and polyglycerin derivatives, and the HLB (Hydrophile-Lipophile Balance) value of the glycerin compound being 19.8 to 20.0.

Throughout the present specification, "polyglycerin" refers to polyglycerin having a glycerin mean polymerization degree of 3 or greater (polyglycerin that is a trimer or more).

Also, throughout the present specification, "diglycerin derivative" refers to a compound having a functional group introduced into diglycerin, and "polyglycerin derivative" refers to a compound having a functional group introduced into polyglycerin that has a glycerin mean polymerization degree of 3 or greater.

With the polishing agent according to the second embodiment of the invention, it is possible to increase the polishing rate for insulating materials while also improving polishing selectivity for insulating materials with respect to stopper materials, compared to a conventional polishing agent. Also, with the polishing agent according to the second embodiment of the invention, in CMP techniques for flattening of STI insulating materials, pre-metal insulating materials, interlayer insulating materials and the like, it is possible to polish these insulating materials at high rate while also improving the polishing selectivity for insulating materials with respect to stopper materials. In addition, the polishing agent according to the second embodiment of the invention can allow the polishing of insulating materials with low polishing scratches while also increasing the polishing rate for insulating materials.

In the polishing agent according to the second embodiment of the invention, the glycerin compound may be a polyoxyalkylene diglyceryl ether, and it may be a polyoxyalkylene polyglyceryl ether. This can further increase the polishing rate for insulating materials while also further improving polishing selectivity for insulating materials with respect to stopper materials.

In the polishing agent of the invention, the hydroxide of a tetravalent metal element is preferably at least one selected from the group consisting of hydroxide of rare earth metal element and hydroxide of zirconium. This can further increase the polishing rate for insulating materials while also further improving polishing selectivity for insulating materials with respect to stopper materials.

The mean particle diameter of the abrasive grain is preferably 1 nm or greater and 300 nm or less. This can further increase the polishing rate for insulating materials while also further improving polishing selectivity for insulating materials with respect to stopper materials.

The content of the abrasive grain is preferably 0.005 mass % or greater and 20 mass % or less based on the total mass of the polishing agent. This can further increase the polishing rate for insulating materials while also further improving polishing selectivity for insulating materials with respect to stopper materials.

The weight-average molecular weight of the glycerin compound is preferably 250 or greater and $10 \times 10^3$ or less. This can further increase the polishing rate for insulating materials while also further improving polishing selectivity for insulating materials with respect to stopper materials.

The content of the glycerin compound is preferably 0.01 mass % or greater and 10 mass % or less based on the total mass of the polishing agent. This can further increase the polishing rate for insulating materials while also further improving polishing selectivity for insulating materials with respect to stopper materials.

The pH of the polishing agent of the invention is preferably 3.0 or greater and 12.0 or less. This can further increase the polishing rate for insulating materials while also further improving polishing selectivity for insulating materials with respect to stopper materials.

One aspect of the invention relates to the use of the aforementioned polishing agent in a polishing method for polishing of a surface to be polished containing silicon oxide. That is, the polishing agent of the invention is preferably used for polishing of the surface to be polished containing silicon oxide.

The polishing agent set of the invention comprises constituent components of the polishing agent separately stored as a first liquid and a second liquid, the first liquid containing the abrasive grain and water, and the second liquid containing the glycerin compound and water. The polishing agent set of the invention can increase the polishing rate for insulating materials while also improving polishing selectivity for insulating materials with respect to stopper materials, compared to the case using a conventional polishing agent.

The polishing method for a base substrate according to a first embodiment of the invention may comprise a step of polishing the surface to be polished of a base substrate using the aforementioned polishing agent, or it may comprise a step of polishing the surface to be polished of a base substrate using a polishing agent obtained by mixing the first liquid and the second liquid of the aforementioned polishing agent set. According to these polishing methods, by using the aforementioned polishing agent or polishing agent set, it is possible to increase the polishing rate for insulating materials while also improving polishing selectivity for insulating materials with respect to stopper materials, compared to the case using a conventional polishing agent. Also, according to these polishing methods, it is possible to minimize occurrence of dishing while also improving the polishing selectivity for insulating materials with respect to stopper materials.

Also, the polishing method for a base substrate according to a second embodiment of the invention is a polishing method for a base substrate having an insulating material and polysilicon, where the polishing method may comprise a step of selectively polishing the insulating material with respect to the polysilicon using the aforementioned polishing agent, or it may comprise a step of selectively polishing the insulating material with respect to the polysilicon using a polishing agent obtained by mixing the first liquid and the second liquid of the aforementioned polishing agent set. According to these polishing methods, by using the aforementioned polishing agent or polishing agent set, it is possible to increase the polishing rate for insulating materials while also improving polishing selectivity for insulating materials with respect to polysilicon, compared to the case using a conventional polishing agent. Also, according to these polishing methods, it is possible to minimize occurrence of dishing while also improving the polishing selectivity for insulating materials with respect to polysilicon.

Advantageous Effects of Invention

According to the invention, it is possible to provide a polishing agent, a polishing agent set and a polishing method that can increase the polishing rate for insulating materials and that can also improve the polishing selectivity for insulating materials with respect to stopper materials. According to the invention, it is possible to provide a polishing agent, a polishing agent set and a polishing method that can increase the polishing rate for insulating materials and that can also improve the polishing selectivity for insulating materials with respect to stopper materials, during the polishing of insulating materials using stoppers. Furthermore, according to the invention, particularly, in CMP techniques for flattening of STI insulating materials, pre-metal insulating materials, interlayer insulating materials and the like, it is possible to provide a polishing agent, a polishing agent set and a polishing method that can polish these insulating materials at high rate and that can also improve the polishing selectivity for insulating materials with respect to stopper materials. In addition, according to the invention, it is possible to allow the polishing of insulating materials with low polishing scratches while also increasing the polishing rate for insulating materials.

DESCRIPTION OF EMBODIMENTS

Figure 1:
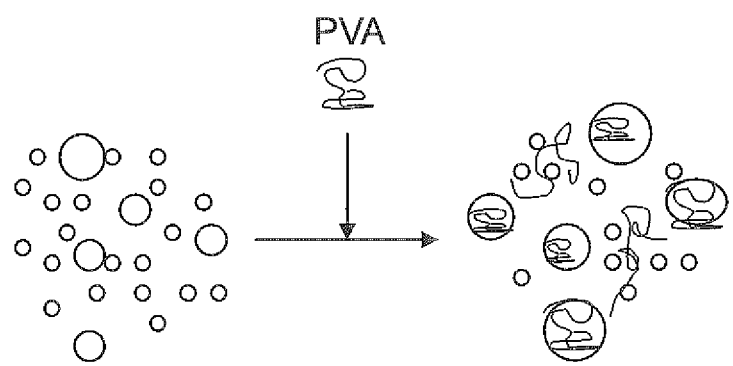
FIG. 1 is a schematic diagram showing the aggregated condition of abrasive grains when an additive has been added.

The polishing agent, the polishing agent set and the polishing method for a base substrate using the polishing agent or the polishing agent set, according to an embodiment of the invention, will now be explained in detail.

The polishing agent of this embodiment is a composition that contacts with a surface to be polished during polishing, and it is a CMP polishing agent, for example. Specifically, the polishing agent of this embodiment comprises at least water, abrasive grains containing a hydroxide of a tetravalent metal element, and a specific glycerin compound. The essential components and optionally added components will now be described.

(Abrasive Grains)

The abrasive grains contain a hydroxide of a tetravalent metal element. Throughout the present specification, the term "hydroxide of a tetravalent metal element" refers to a compound containing a tetravalent metal ($M^{4+}$) and at least one hydroxide ion ($OH^-$). The hydroxide of a tetravalent metal element may contain an anion other than a hydroxide ion (for example, a nitrate ion $NO_3^-$ and sulfate ion $SO_4^{2-}$). For example, the hydroxide of a tetravalent metal element may contain an anion (for example, a nitrate ion $NO_3^-$ and sulfate ion $SO_4^{2-}$) bonded to a tetravalent metal element.

Abrasive grains containing a hydroxide of a tetravalent metal element have high reactivity with insulating materials (such as silicon oxide) compared to conventional abrasive grains composed of silica, ceria or the like, and are able to polish insulating materials at high polishing rates. In a polishing agent according to this embodiment, other abrasive grains may be used in addition to abrasive grains containing a hydroxide of a tetravalent metal element. Such other abrasive grains may be, for example, particles of silica, alumina, ceria or the like. Also, composite particles containing a hydroxide of a tetravalent metal element and silica may be used as the abrasive grains containing a hydroxide of a tetravalent metal element.

For the abrasive grains, the content of the hydroxide of a tetravalent metal element is preferably 80 mass % or greater, more preferably 90 mass % or greater, even more preferably 95 mass % or greater, especially preferably 98 mass % or greater and extremely preferably 99 mass % or greater, based on the total abrasive grains. From the viewpoint of more excellent polishing properties as well as easier preparation of the polishing agent, it is most preferred for the abrasive grains to be composed of a hydroxide of a tetravalent metal element (i.e. 100 mass % of the abrasive grains consists of particles of the hydroxide of a tetravalent metal element).

The hydroxide of a tetravalent metal element is preferably at least one selected from the group consisting of hydroxide of rare earth metal element and hydroxide of zirconium. The hydroxide of a tetravalent metal element is preferably a hydroxide of rare earth metal element, from the viewpoint of further increasing the polishing rate for insulating materials.

Rare earth metal elements that can adopt tetravalent forms include lanthanoids such as cerium, praseodymium and terbium, among which lanthanoids are preferred and cerium is more preferred from the viewpoint of a more excellent polishing rate for insulating materials. A hydroxide of rare earth metal element and hydroxide of zirconium may be used in combination, or two or more may be selected for use from among hydroxides of rare earth metal element.

The lower limit for the mean particle diameter of the abrasive grains in the polishing agent or the slurry of the polishing agent set described hereunder is preferably 1 nm or greater, more preferably 2 nm or greater and even more preferably 3 nm or greater, from the viewpoint of further increasing the polishing rate for insulating materials. The upper limit for the mean particle diameter of the abrasive grains is preferably 300 nm or less, more preferably 250 nm or less, even more preferably 200 nm or less, especially preferably 100 nm or less and extremely preferably 50 nm or less, from the viewpoint of further minimizing scratches at the surface to be polished. From these viewpoints, the mean particle diameter of the abrasive grains is more preferably 1 nm or greater and 300 nm or less.

The "mean particle diameter" of the abrasive grains is the mean secondary particle size of the abrasive grains. For example, the mean particle diameter of the abrasive grains can be measured for the polishing agent or the slurry of the polishing agent set described hereunder, using an optical diffraction scattering particle size distribution meter (for example, trade name: N5 by Beckman Coulter, Inc. or trade name: Zetasizer 3000HSA by Malvern Instruments, Inc.).

Of the constituent components of the polishing agent of this embodiment, the hydroxide of a tetravalent metal element is believed to have a major effect on the polishing properties. Thus, adjusting the content of the hydroxide of a tetravalent metal element can improve chemical interaction between the abrasive grains and the surface to be polished, and further increase the polishing rate. Therefore, the content of the hydroxide of a tetravalent metal element is preferably 0.01 mass % or greater, more preferably 0.03 mass % or greater and even more preferably 0.05 mass % or greater, based on the total mass of the polishing agent. Also, from the viewpoint of easily avoiding aggregation of the abrasive grains while obtaining satisfactory chemical interaction with the surface to be polished and effectively making use of the abrasive grain properties, the content of the hydroxide of a tetravalent metal element is preferably 8 mass % or less, more preferably 5 mass % or less, even more preferably 3 mass % or less, especially preferably 1 mass % or less, extremely more preferably 0.5 mass % or less and very preferably 0.3 mass % or less, based on the total mass of the polishing agent.

From the viewpoint of further increasing the polishing rate for insulating materials, the lower limit for the abrasive grain content is preferably 0.005 mass % or greater, more preferably 0.01 mass % or greater, even more preferably 0.02 mass % or greater, especially preferably 0.04 mass % or greater and extremely preferably 0.05 mass % or greater, based on the total mass of the polishing agent. From the viewpoint of increasing the storage stability of the polishing agent, the upper limit for the abrasive grain content is preferably 20 mass % or less, more preferably 15 mass % or less and even more preferably 10 mass % or less, based on the total mass of the polishing agent. From these viewpoints, the abrasive grain content is more preferably 0.005 mass % or greater and 20 mass % or less based on the total mass of the polishing agent.

The abrasive grain content is preferably even further reduced to allow further reduction in cost and polishing scratches. A low abrasive grain content will tend to lower the polishing rate for insulating materials and the like. On the other hand, the abrasive grains containing a hydroxide of a tetravalent metal element allow a prescribed polishing rate to be obtained even when used in small amounts, and therefore the abrasive grain content can be further reduced while maintaining balance between the polishing rate and the advantages of reducing the abrasive grain content. From this viewpoint, the abrasive grain content is preferably 5 mass % or less, more preferably 3 mass % or less, even more preferably 1 mass % or less, especially preferably 0.5 mass % or less and extremely preferably 0.3 mass % or less.

[Absorbance]

The abrasive grains preferably comprise a hydroxide of a tetravalent metal element and also satisfy at least one of the following conditions (a) and (b). An "aqueous dispersion" having an abrasive grain content adjusted to a prescribed content is a liquid containing a prescribed content of abrasive grains and water.

(a) The abrasive grains produce absorbance of 1.00 or greater for light with a wavelength of 400 nm in an aqueous dispersion having the abrasive grain content adjusted to 1.0 mass %.

(b) The abrasive grains produce absorbance of 1.000 or greater for light with a wavelength of 290 nm in an aqueous dispersion having the abrasive grain content adjusted to 0.0065 mass %.

With regard to the condition (a), the polishing rate can be even further increased by using abrasive grains that produce absorbance of 1.00 or greater for light with a wavelength of 400 nm in an aqueous dispersion having the abrasive grain content adjusted to 1.0 mass %. The reason for this is not fully understood, but the present inventors conjecture as follows. Specifically, it is thought that particles, containing $M(OH)_a X_b$ composed of a tetravalent metal ($M^{4+}$), 1 to 3 hydroxide ions ($OH^-$) and 1 to 3 anions ($X^{c-}$) (wherein a+b×c=4), are produced as part of the abrasive grains, depending on the production conditions for the hydroxide of a tetravalent metal element (such particles are also "abrasive grains containing a hydroxide of a tetravalent metal element"). In the formula $M(OH)_a X_b$, presumably, the electron-withdrawing anion ($X^{c-}$) acts to increase the hydroxide ion reactivity, thus the polishing rate increases as the abundance of $M(OH)_a X_b$ increases. Also, since the particles containing $M(OH)_a X_b$ absorb light with a wavelength of 400 nm, presumably an increased abundance of $M(OH)_a X_b$ causes increased absorbance for light with a wavelength of 400 nm, and increases the polishing rate.

Abrasive grains containing a hydroxide of a tetravalent metal element presumably contain not only $M(OH)_a X_b$ but also $M(OH)_4$, $MO_2$ and the like. The anion ($X^{c-}$) may be $NO_3^-$ and $SO_4^{2-}$, for example.

It is possible to confirm that the abrasive grain containing a hydroxide of a tetravalent metal element includes $M(OH)_a X_b$ by the method of detecting the peak corresponding to the anion ($X^{c-}$) with FT-IR ATR method (Fourier transform Infra Red Spectrometer Attenuated Total Reflection method) after thoroughly washing the abrasive grain with purified water. The presence of the anion ($X^{c-}$) can be also confirmed by XPS method (X-ray Photoelectron Spectroscopy method).

The absorption peak of $M(OH)_a X_b$ (for example, $M(OH)_3 X$) at a wavelength of 400 nm has been confirmed to be much lower than the absorption peak at a wavelength of 290 nm described below. In this regard, as a result of studying degrees of absorbance using aqueous dispersions with relatively high abrasive grain contents of 1.0 mass %, which allow absorbance to be easily detected as high absorbance, the present inventors have found that the effect of increasing polishing rate is superior when using abrasive grains that produce absorbance of 1.00 or greater for light with a wavelength of 400 nm in the aqueous dispersion. Incidentally, since it is thought that the absorbance for light with a wavelength of 400 nm derives from the abrasive grains, as explained above, it is difficult to obtain the effect of increased polishing rate with a polishing agent containing a substance (such as a pigment component exhibiting a yellow color) that produces absorbance of 1.00 or greater for light with a wavelength of 400 nm, instead of abrasive grains that produce absorbance of 1.00 or greater for light with a wavelength of 400 nm.

With regard to the condition (b), the polishing rate can be even further increased by using abrasive grains that produce absorbance of 1.000 or greater for light with a wavelength of 290 nm in an aqueous dispersion having the abrasive grain content adjusted to 0.0065 mass %. The reason for this is not fully understood, but the present inventors conjecture as follows. Specifically, particles containing $M(OH)_aX_b$ (for example, $M(OH)_3X$) that are produced depending on the production conditions for the hydroxide of a tetravalent metal element have a calculated absorption peak near a wavelength of 290 nm, and for example, particles composed of $Ce^{4+}(OH^-)_3NO_3^-$ have an absorption peak at a wavelength of 290 nm. Consequently, it is believed that the polishing rate is increased in accordance with the increase in absorbance for light with a wavelength of 290 nm due to the increase in the abundance of $M(OH)_aX_b$.

The absorbance for light near a wavelength of 290 nm tends to be detected to a greater degree as the measuring limit is exceeded. In this regard, as a result of studying degrees of absorbance using aqueous dispersions with relatively low abrasive grain contents of 0.0065 mass %, which allow absorbance to be easily detected as low absorbance, the present inventors have found that the effect of increasing polishing rate is superior when using abrasive grains that produce absorbance of 1.000 or greater for light with a wavelength of 290 nm in the aqueous dispersion. The present inventors have also found that, apart from light near a wavelength of 400 nm, which when absorbed by an absorbing substance tends to cause the absorbing substance to exhibit a yellow color, higher absorbance for light near a wavelength of 290 nm of abrasive grains produces deeper yellowishness in a polishing agent and slurry employing such abrasive grains, and that deeper yellowishness of the polishing agent and slurry produces an increased polishing rate. Also, the present inventors found that the absorbance for light with a wavelength of 290 nm in an aqueous dispersion with an abrasive grain content of 0.0065 mass % and the absorbance for light with a wavelength of 400 nm in an aqueous dispersion with an abrasive grain content of 1.0 mass % are correlated.

The lower limit for the absorbance of light with a wavelength of 290 nm is preferably 1.000 or greater, more preferably 1.050 or greater, even more preferably 1.100 or greater, especially preferably 1.130 or greater and extremely preferably 1.150 or greater, from the viewpoint of allowing polishing of insulating materials at an even more superior polishing rate. The upper limit for the absorbance for light with a wavelength of 290 nm is not particularly restricted, but is preferably 10.00, for example.

If abrasive grains, producing absorbance of 1.00 or greater for light with a wavelength of 400 nm, produce absorbance of 1.000 or greater for light with a wavelength of 290 nm in an aqueous dispersion having the abrasive grain content adjusted to 0.0065 mass %, it is possible to polish the insulating materials at an even more excellent polishing rate.

Also, hydroxides of the tetravalent metal element (such as $M(OH)_aX_b$) tend not to exhibit absorption for light with wavelengths of 450 nm or greater, and especially for light with wavelengths of 450 to 600 nm. Therefore, from the viewpoint of minimizing adverse effects on polishing by the presence of impurities and accomplishing polishing of insulating materials at even more excellent polishing rates, the abrasive grains preferably produce absorbance of 0.010 or less for light with a wavelength of 450 to 600 nm in an aqueous dispersion having the abrasive grain content adjusted to 0.0065 mass % (65 ppm). Specifically, the absorbance preferably does not exceed 0.010 for all light within a wavelength range of 450 to 600 nm in an aqueous dispersion having the abrasive grain content adjusted to 0.0065 mass %. The upper limit for the absorbance for light with a wavelength of 450 to 600 nm is more preferably 0.005 or less and even more preferably 0.001 or less. The lower limit for the absorbance for light with a wavelength of 450 to 600 nm is preferably 0.

The absorbance in an aqueous dispersion can be measured, for example, using a spectrophotometer (apparatus name: U3310) by Hitachi, Ltd. Specifically, an aqueous dispersion having the abrasive grain content adjusted to 1.0 mass % or 0.0065 mass % is prepared as a measuring sample. Approximately 4 mL of the measuring sample is placed in a 1 cm-square cell, and the cell is set in the apparatus. Spectrophotometry is then conducted in a wavelength range of 200 to 600 nm, and the absorbance is judged from the obtained chart.

Screening of the absorbance may be accomplished by assuming that if absorbance of 1.00 or greater is exhibited when the absorbance for light with a wavelength of 400 nm is measured with excessive dilution so that the abrasive grain content is lower than 1.0 mass %, the absorbance will also be 1.00 or greater when the abrasive grain content is 1.0 mass %. Screening of the absorbance may be accomplished by assuming that if absorbance of 1.000 or greater is exhibited when the absorbance for light with a wavelength of 290 nm is measured with excessive dilution so that the abrasive grain content is lower than 0.0065 mass %, the absorbance will also be 1.000 or greater when the abrasive grain content is 0.0065 mass %. Screening of the absorbance may be accomplished by assuming that if absorbance of 0.010 or less is exhibited when the absorbance for light with a wavelength of 450 to 600 nm is measured with dilution so that the abrasive grain content is greater than 0.0065 mass %, the absorbance will also be 0.010 or less when the abrasive grain content is 0.0065 mass %.

[Light Transmittance]

The polishing agent of this embodiment preferably has high transparency for visible light (it is visually transparent or nearly transparent). Specifically, the abrasive grains comprised in the polishing agent of this embodiment preferably produce light transmittance of 50%/cm or greater for light with a wavelength of 500 nm in an aqueous dispersion having the abrasive grain content adjusted to 1.0 mass %. This can further inhibit reduction in polishing rate due to addition of additives, thus making it easier to obtain other properties while maintaining polishing rate. From this viewpoint, the lower limit for the light transmittance is more preferably 60%/cm or greater, even more preferably 70%/cm or greater, especially preferably 80%/cm or greater, extremely preferably 90%/cm or greater and very preferably 92%/cm or greater. The upper limit for the light transmittance is 100%/cm.

Although the reason for which reduction in polishing rate can be inhibited by adjusting the light transmittance of the abrasive grains is not thoroughly understood, the present inventors conjecture as follows. With abrasive grains containing a hydroxide of a tetravalent metal element (such as cerium), chemical effects are believed to be predominant over mechanical effects. Therefore, the number of abrasive grains is believed to contribute to the polishing rate more than the sizes of the abrasive grains.

In the case of low light transmittance in an aqueous dispersion having an abrasive grain content of 1.0 mass %, the abrasive grains present in the aqueous dispersion presumably have relatively more particles with large particle diameters (hereunder referred to as "coarse particles"). When an additive (such as polyvinyl alcohol (PVA)) is added to a polishing agent containing such abrasive grains, other particles aggregate around the coarse particles as nuclei, as shown in FIG. 1. As a result, the number of abrasive grains acting on the surface to be polished per unit area (the effective abrasive grain number) is reduced, thus the specific surface area of the abrasive grains contacting with the surface to be polished is reduced, whereby presumably reduction in polishing rate occurs.

Figure 2:
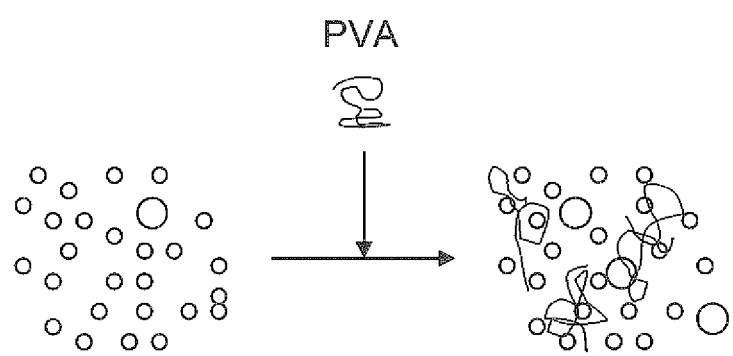
FIG. 2 is a schematic diagram showing the aggregated condition of abrasive grains when an additive has been added.

Conversely, in the case of high light transmittance in an aqueous dispersion having an abrasive grain content of 1.0 mass %, the abrasive grains present in the aqueous dispersion presumably have fewer "coarse particles". In such cases with a low abundance of coarse particles, as shown in FIG. 2, few coarse particles are available as nuclei for aggregation, and therefore aggregation between abrasive grains is inhibited or the sizes of the aggregated particles are smaller than the aggregated particles shown in FIG. 1, even when an additive (such as polyvinyl alcohol) is added to the polishing agent. As a result, the number of abrasive grains acting on the surface to be polished per unit area (the effective abrasive grain number) is maintained, thus the specific surface area of the abrasive grains contacting with the surface to be polished is maintained, whereby presumably reduction in the polishing rate hardly occur.

According to research by the present inventors, it was found that even among polishing agents having identical particle diameters to each other as measured with a common particle diameter measuring apparatus, some may be visually transparent (high light transmittance) and some may be visually turbid (low light transmittance). This suggests that coarse particles, which can produce the effect described above, can contribute to reduction in the polishing rate even in slight amounts that cannot be detected with common particle diameter measuring apparatuses.

It has also been found that even repeated filtration to reduce the amount of coarse particles does not significantly improve the phenomenon of reduced polishing rate with addition of additives, and in some cases the effect of increased polishing rate due to absorbance is not adequately exhibited. The present inventors found that this problem can be overcome by using abrasive grains with high light transmittance in aqueous dispersion, for example, by modifying the method for producing the abrasive grains.

The light transmittance is the transmittance for light with a wavelength of 500 nm. The light transmittance can be measured using a spectrophotometer. Specifically, it can be measured with an U3310 Spectrophotometer (apparatus name) by Hitachi, Ltd., for example.

As a more specific measuring method, an aqueous dispersion having the abrasive grain content adjusted to 1.0 mass % is prepared as a measuring sample. Approximately 4 mL of this measuring sample is placed in a 1 cm-square cell, the cell is set in the apparatus, and then measurement is conducted. It is clear that, if the light transmittance is 50%/cm or greater in an aqueous dispersion having an abrasive grain content of greater than 1.0 mass %, the light transmittance will also be 50%/cm or greater when it is diluted to 1.0 mass %. Therefore, using an aqueous dispersion having an abrasive grain content of greater than 1.0 mass % allows screening of the light transmittance by a simple method.

The absorbance and light transmittance produced in the aqueous dispersion by abrasive grains comprised in the polishing agent can be measured by preparing an aqueous dispersion having a prescribed abrasive grain content after removing the solid components other than the abrasive grains and the liquid components other than water, and using the aqueous dispersion for measurement. Depending on the components in the polishing agent, the solid components and liquid components can be removed, for example, using a centrifugal separation method such as centrifugal separation using a centrifuge capable of applying gravitational acceleration of up to several thousand G or ultracentrifugation using an ultracentrifuge capable of applying gravitational acceleration of several tens of thousands G or more; a chromatographic method such as partition chromatography, adsorption chromatography, gel permeation chromatography or ion-exchange chromatography; a filtration method such as natural filtration, filtration under reduced pressure, pressure filtration or ultrafiltration; a distillation method such as vacuum distillation or atmospheric distillation, or a combination of the foregoing.

For example, when it contains a compound with a weight-average molecular weight of several tens of thousands or greater (for example, 50000 or greater), a chromatographic method, filtration method or the like is exemplified, with gel permeation chromatography and ultrafiltration being preferred among them. When a filtration method is to be used, the abrasive grains comprised in the polishing agent can pass through the filter by appropriately setting the conditions. For example, when it contains a compound with a weight-average molecular weight of up to several tens of thousands (for example, less than 50000), a chromatographic method, filtration method, distillation method or the like is exemplified, with gel permeation chromatography, ultrafiltration and vacuum distillation being preferred among them. When a plural types of abrasive grains are contained, a filtration method, centrifugal separation method or the like is exemplified and more abrasive grains containing the hydroxide of a tetravalent metal element will be present in the filtrate in the case of filtration or in the liquid phase in the case of centrifugal separation.

With regard to the method of separating abrasive grains by a chromatographic method, for example, the abrasive grain component can be separated and/or the other components can be separated, under the following conditions.

Sample Solution: Polishing Agent 100 μL

Detector: UV-VIS Detector by Hitachi, Ltd., trade name: "L-4200", wavelength: 400 nm Integrator: GPC integrator by Hitachi, Ltd., trade name: "D-2500"

Pump: Trade name: "L-7100" by Hitachi, Ltd.

Column: Aqueous HPLC packed column, trade name: "GL-W550S" by Hitachi Chemical Co., Ltd.

Eluent: Deionized water

Measuring temperature: 23° C.

Flow rate: 1 mL/min (pressure: approximately 40-50 kg/cm$^2$)

Measuring time: 60 minutes

Before chromatography, eluent deaerating treatment is preferably carried out using a deaeration apparatus. When a deaeration apparatus cannot be used, the eluent is preferably subjected to deaerating treatment beforehand with ultrasonic waves or the like.

Depending on the components comprised in the polishing agent, it may not be possible to separate the abrasive grain component under the conditions described above, and in such cases, separation can be accomplished by optimizing the sample solution amount, the column type, the eluent type, the measuring temperature, the flow rate and the like. Also, by adjusting the pH of the polishing agent to adjust the elution time of the components comprised in the polishing agent, it may be possible to separate the abrasive grains. When the polishing agent contains insoluble components, the insoluble components are preferably removed as necessary by filtration, centrifugal separation or the like.

[Method for Producing Abrasive Grains]

The hydroxide of a tetravalent metal element can be produced by reacting a tetravalent metal element salt (metal salt) with an alkaline source (base). The hydroxide of a tetravalent metal element is preferably produced by mixing a tetravalent metal element salt with an alkali solution (for example, an aqueous alkali solution). This will allow particles with extremely fine particle diameters to be obtained, so that the polishing agent with an even more excellent effect of reducing polishing scratches can be obtained. This method is disclosed in Patent Literature 5, for example. The hydroxide of a tetravalent metal element can be obtained by mixing a metal salt solution of a tetravalent metal element salt (for example, an aqueous metal salt solution) with an alkali solution. When either or both the tetravalent metal element salt and alkaline source is to be supplied to the reaction system in a liquid state, there is no limitation to the means for mixing the liquid mixture. For example, there may be mentioned a method of stirring the liquid mixture using a rod, plate or propeller-shaped stirrer or a stirring blade rotating around a rotating shaft, a method of stirring the liquid mixture by rotating a stirrer in a rotating magnetic field using a magnetic stirrer that transmits mechanical power from outside of the container, a method of stirring the liquid mixture with a pump installed outside of the tank, and a method of stirring the liquid mixture by blowing in pressurized external air with force into the tank. The tetravalent metal element salt used may be a known one without any particular restrictions, and this includes $M(NO_3)_4$, $M(SO_4)_2$, $M(NH_4)_2(NO_3)_6$, $M(NH_4)_4(SO_4)_4$ (where M represents a rare earth metal element), $Zr(SO_4)_2 \cdot 4H_2O$ and the like. M is preferably chemically active cerium (Ce).

The means for adjusting the absorbance or light transmittance may be optimization of the method for producing the hydroxide of a tetravalent metal element. The method of varying the absorbance for light with a wavelength of 400 nm or the absorbance for light with a wavelength of 290 nm may be, specifically, selecting the alkaline source in the alkali solution, adjusting the raw material concentration of the metal salt solution and the alkali solution, adjusting the mixing rate of the metal salt solution and the alkali solution, or adjusting the liquid temperature of the liquid mixture obtained by mixing the tetravalent metal element salt and alkaline source. Also, the method of varying the light transmittance for light with a wavelength of 500 nm may be, specifically, adjusting the raw material concentration of the metal salt solution and the alkali solution, adjusting the mixing rate of the metal salt solution and the alkali solution, adjusting the stirring speed for mixing, or adjusting the liquid temperature of the liquid mixture.

In order to increase the absorbance for light with a wavelength of 400 nm, the absorbance for light with a wavelength of 290 nm and light transmittance for light with a wavelength of 500 nm, the method for producing the hydroxide of a tetravalent metal element is preferably more "moderate". Here, "moderate" means a moderate (slow) pH increase when the pH of the reaction system increases as the reaction proceeds. Conversely, in order to decrease the absorbance for light with a wavelength of 400 nm, the absorbance for light with a wavelength of 290 nm and light transmittance for light with a wavelength of 500 nm, the method for producing the hydroxide of a tetravalent metal element is preferably more "intense". Here, "intense" means an intense (rapid) pH increase when the pH of the reaction system increases as the reaction proceeds. In order to adjust the absorbance and light transmittance values to the prescribed ranges, it is preferred to optimize the method for producing the hydroxide of a tetravalent metal element based on these tendencies. A method of controlling the absorbance and light transmittance will now be explained in greater detail.

{Alkaline Source}

A known alkaline source may be used in the alkali solution, without any particular restrictions. The alkaline source may be an organic base, inorganic base and the like. The organic base may be a nitrogen-containing organic base such as guanidine, triethylamine and chitosan; a nitrogen-containing heterocyclic organic base such as pyridine, piperidine, pyrrolidine and imidazole; an ammonium salt such as ammonium carbonate, ammonium hydrogencarbonate, tetramethylammonium hydroxide (TMAH), tetraethylammonium hydroxide, tetramethylammonium chloride and tetraethylammonium chloride. Inorganic bases may be ammonia and inorganic salts of alkali metals such as lithium hydroxide, sodium hydroxide, potassium hydroxide, calcium hydroxide, lithium carbonate, sodium carbonate, potassium carbonate, lithium hydrogencarbonate, sodium hydrogencarbonate and potassium hydrogencarbonate. The alkaline source used may be a single type alone or a combination of two or more types.

From the viewpoint of further increasing the polishing rate for insulating materials, the alkaline source is preferably ammonia and imidazole, and even more preferably imidazole. In order to increase the absorbance for light with a wavelength of 400 nm and the absorbance for light with a wavelength of 290 nm, the alkaline source used is preferably an alkaline source exhibiting weak basicity. Among alkaline sources, nitrogen-containing heterocyclic organic bases are preferred, pyridine, piperidine, pyrrolidine and imidazole are more preferred, pyridine and imidazole are even more preferred, and imidazole is especially preferred.

{Concentration}

The absorbance for light with a wavelength of 400 nm, the absorbance for light with a wavelength of 290 nm and the light transmittance for light with a wavelength of 500 nm can be varied by controlling the raw material concentrations in the metal salt solution and alkali solution. Specifically, the absorbance will tend to be increased with a higher metal salt concentration of the metal salt solution, while the absorbance will tend to be increased with a lower alkaline concentration (base concentration, alkaline source concentration) of the alkali solution. Also, the light transmittance will tend to be increased with a higher metal salt concentration, while the light transmittance will tend to be increased with a lower alkaline concentration.

From the viewpoint of easily obtaining both excellent polishing rate and excellent stability of the abrasive grains, the upper limit for the metal salt concentration of the metal salt solution is preferably 1.000 mol/L or less, more preferably 0.500 mol/L or less, even more preferably 0.300 mol/L or less and especially preferably 0.200 mol/L or less, based on the total metal salt solution. The lower limit for the metal salt concentration is preferably 0.010 mol/L or greater, more preferably 0.020 mol/L or greater and even more preferably 0.030 mol/L or greater, based on the total metal salt solution, from the viewpoint of inhibiting rapid reaction (allowing the pH increase to be more moderate) while increasing the absorbance for light with a wavelength of 400 nm, absorbance for light with a wavelength of 290 nm and light transmittance for light with a wavelength of 500 nm.

From the viewpoint of inhibiting rapid reaction, the upper limit for the alkaline concentration of the alkali solution is preferably 15.0 mol/L or less, more preferably 12.0 mol/L or less and even more preferably 10.0 mol/L or less, based on the total alkali solution. There is no particular limit on the lower limit for the alkaline concentration, but from the viewpoint of productivity, it is preferably 0.001 mol/L or greater based on the total alkali solution.

The alkaline concentration of the alkali solution is preferably adjusted as appropriate depending on the type of alkaline source selected. For example, with an alkaline source wherein the pKa of the conjugate acid of the alkaline source is 20 or higher, the upper limit for the alkaline concentration is preferably 0.10 mol/L or less and more preferably 0.05 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.001 mol/L or greater based on the total alkali solution.

With an alkaline source wherein the pKa of the conjugate acid of the alkaline source is 12 or higher and lower than 20, the upper limit for the alkaline concentration is preferably 1.0 mol/L or less and more preferably 0.50 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.01 mol/L or greater based on the total alkali solution.

With an alkaline source wherein the pKa of the conjugate acid of the alkaline source is lower than 12, the upper limit for the alkaline concentration is preferably 15.0 mol/L or less and more preferably 10.0 mol/L or less, based on the total alkali solution, from the viewpoint of inhibiting rapid reaction. There are no particular restrictions on the lower limit for the alkaline concentration, but from the viewpoint of minimizing the amount of solution to be used for obtaining a prescribed amount of a hydroxide of a tetravalent metal element, it is preferably 0.10 mol/L or greater based on the total alkali solution.

An example of an alkaline source wherein the pKa of the conjugate acid of the alkaline source is 20 or greater includes 1,8-diazabicyclo[5.4.0]undeca-7-ene (pKa: 25). Examples of alkaline sources wherein the pKa of the conjugate acid of the alkaline source is 12 or higher and lower than 20 include potassium hydroxide (pKa: 16) and sodium hydroxide (pKa: 13). Examples of alkaline sources wherein the pKa of the conjugate acid of the alkaline source is lower than 12 include ammonia (pKa: 9) and imidazole (pKa: 7). The pKa value of the conjugate acid of the alkaline source to be used is not particularly restricted so long as the alkaline concentration is appropriately adjusted, but the pKa of the conjugate acid of the alkaline source is preferably lower than 20, more preferably lower than 12, even more preferably lower than 10 and especially preferably lower than 8.

{Mixing Rate}

The absorbance for light with a wavelength of 400 nm, the absorbance for light with a wavelength of 290 nm and the light transmittance for light with a wavelength of 500 nm can be varied by controlling the mixing rate of the metal salt solution and alkali solution. The absorbance and light transmittance respectively tend to be increased when the pH increase is moderate (slow). More specifically, the absorbance tends to be higher when the mixing rate is decreased, while the absorbance tends to be lower when the mixing rate is increased. Also, the light transmittance tends to be higher when the mixing rate is decreased, while the light transmittance tends to be lower when the mixing rate is increased.

The upper limit for the mixing rate is preferably $5.00 \times 10^{-3}$ $m^3$/min (5 L/min) or less, more preferably $1.00 \times 10^{-3}$ $m^3$/min (1 L/min) or less, even more preferably $5.00 \times 10^{-4}$ $m^3$/min (500 mL/min) or less and especially preferably $1.00 \times 10^{-4}$ $m^3$/min (100 mL/min) or less, from the viewpoint of further inhibiting rapid reaction while further inhibiting local imbalance of the reaction. The lower limit for the mixing rate is not particularly restricted, but is preferably $1.00 \times 10^{-7}$ $m^3$/min (0.1 mL/min) or greater from the viewpoint of productivity.

{Stirring Speed}

By controlling the stirring speed for mixing of the metal salt solution and the alkali solution, it is possible to vary the light transmittance for light with a wavelength of 500 nm. Specifically, the light transmittance tends to be higher when the stirring speed is increased, while the light transmittance tends to be lower when the stirring speed is decreased.

From the viewpoint of further inhibiting local imbalance of the reaction and obtaining excellent mixing efficiency, the lower limit for the stirring speed is preferably 30 $min^{-1}$ or greater, more preferably 50 $min^{-1}$ or greater and even more preferably 80 $min^{-1}$ or greater. The upper limit for the stirring speed is not particularly restricted, and it will need to be appropriately adjusted depending on the size and shape of the stirring blade, but it is preferably 1000 $min^{-1}$ or less from the viewpoint of preventing splashing of liquid.

{Liquid Temperature (Synthesis Temperature)}

By controlling the liquid temperature of the liquid mixture obtained by mixing the tetravalent metal element salt and the alkaline source, it is possible to vary the absorbance for light with a wavelength of 400 nm, the absorbance for light with a wavelength of 290 nm and the light transmittance for light with a wavelength of 500 nm, and to obtain abrasive grains that allow the desired polishing rate and storage stability to be achieved. Specifically, the absorbance tends to be higher when the liquid temperature is reduced, while the absorbance tends to be lower when the liquid temperature is increased. Also, the light transmittance tends to be higher when the liquid temperature is reduced, while the light transmittance tends to be lower when the liquid temperature is increased.

The liquid temperature is, for example, the temperature in the liquid mixture as read from a thermometer set in the liquid mixture, and it is preferably 0° C. to 100° C. The upper limit for the liquid temperature is preferably 100° C. or less, more preferably 60° C. or less, even more preferably 55° C. or less, especially preferably 50° C. or less and extremely preferably 45° C. or less, from the viewpoint of allowing rapid reaction to be inhibited. From the viewpoint of facilitating progression of the reaction, the lower limit for the liquid temperature is preferably 0° C. or greater, more preferably 10° C. or greater and even more preferably 20° C. or greater.

The hydroxide of a tetravalent metal element synthesized by the method above sometimes contains impurities (for example, metal impurities), but the impurities can be removed by washing. Washing of the hydroxide of a tetravalent metal element may be accomplished by a method of repeated solid-liquid separation by centrifugal separation or the like. Washing can also be accomplished by ion removal, using centrifugal separation, dialysis, ultrafiltration, an ion exchange resin, or the like. The absorbance for light with a wavelength of 450 to 600 nm can be adjusted by removing impurities.

When the obtained abrasive grains are aggregated, they can be dispersed in water by an appropriate method. The method for dispersing the abrasive grains in water as the major dispersing medium may be mechanical dispersion treatment with a homogenizer, ultrasonic disperser, wet ball mill or the like, in addition to dispersion treatment with a stirrer. The dispersion method and particle diameter control method may be the methods described in Non-Patent Literature 1, for example. Also, the washing treatment above may be carried out to lower the electric conductivity of the dispersion containing the abrasive grains (500 mS/m or less, for example), thereby increasing the dispersibility of the abrasive grains. Thus, the washing treatment above may be applied as dispersion treatment, or the washing treatment above and dispersion treatment may be combined.

(Additives)

The polishing agent of this embodiment comprises an additive. Here, "additive" refers to a substance that is added to the polishing agent in addition to water and abrasive grains, in order to adjust the polishing properties such as polishing rate and polishing selectivity; the polishing agent properties such as abrasive grain dispersibility and storage stability; and the like.

[First Additive: Glycerin Compound]

The polishing agent of this embodiment comprises a glycerin compound as the first additive. The first additive has an effect of increasing the polishing rate for the insulating material. Presumably, the hydroxyl group of the glycerin compound interacts with the abrasive grains and insulating material to bridge the abrasive grains and the insulating material with hydrogen bonding, and therefore, interaction between the abrasive grains and the insulating material can be increased. The first additive also has an effect of inhibiting the polishing rate for the stopper material. Presumably, the hydroxyl group of the glycerin compound interacts with the abrasive grains to increase the hydrophilicity of the abrasive grain surfaces, and therefore, interaction between the abrasive grains and the hydrophobic stopper material can be reduced. However, the action mechanism is not limited to the one described above.

A first aspect of the glycerin compound is at least one selected from the group consisting of compounds represented by general formula (I) below and compounds represented by general formula (II) below.

[Chemical Formula 5]

[In formula (I), m is an integer of 3 or greater.]

[Chemical Formula 6]

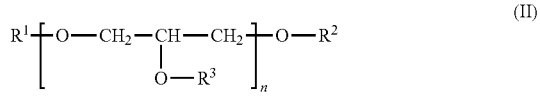

[In formula (II), n represents an integer of 2 or greater, and $R^1$, $R^2$ and the multiple $R^3$ each independently represent hydrogen atom, a group represented by general formula (III) below or a group represented by general formula (IV) below. The case where $R^1$, $R^2$ and the multiple $R^3$ are all hydrogen atom is excluded.]

[Chemical Formula 7]

[In formula (III), p represents an integer of 1 or greater.]

[Chemical Formula 8]

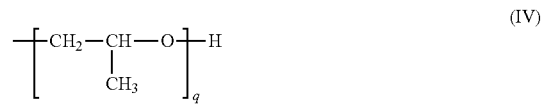

[In formula (IV), q represents an integer of 1 or greater.]

In formula (I), m is 3 or greater, preferably 4 or greater, more preferably 5 or greater and even more preferably 10 or greater, from the viewpoint of increasing the polishing rate for the insulating material. From the viewpoint of production, m is preferably 100 or less, more preferably 50 or less and even more preferably 30 or less.

In formula (I), the structural unit of the $[C_3H_5(OH)O]$ portion may be, for example, a structural unit represented by any of formulas (Va) to (Vc) below. The compound represented by formula (I) may be a compound having one type from among formulas (Va) to (Vc), or it may be a compound having more than one from among formulas (Va) to (Vc). In a compound having more than one from among formulas (Va) to (Vc), the arrangement of the structural units may be as desired. For example, it may have any desired form such as (a) the form of a block copolymer with the same structural units in continuity, (b) the form of a random copolymer having a structural unit A and a structural unit B arranged in no particular order, or (c) the form of an alternating copolymer having a structural unit A and a structural unit B in an alternating arrangement. An example of compounds represented by formula (I) includes compounds represented by formula (VIa) below and compounds represented by formula (VIb) below.

[Chemical Formula 9]

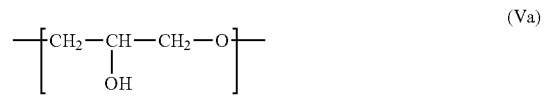

[Chemical Formula 10]

[Chemical Formula 11]

[Chemical Formula 12]

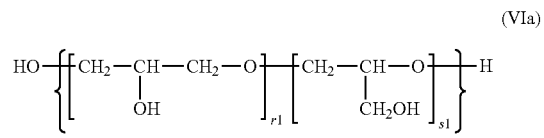

[In formula (VIa), r1 represents an integer of 0 or greater, s1 represents an integer of 0 or greater, and r1+s1 is an integer of 3 or greater.]

[Chemical Formula 13]

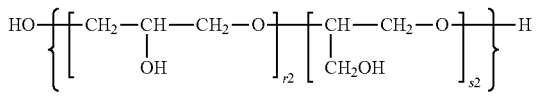

(VIb)

[In formula (VIb), r2 represents an integer of 0 or greater, s2 represents an integer of 0 or greater, and r2+s2 is an integer of 3 or greater.]

The compound represented by formula (VIa) may lack one of the [CH$_2$CH(OH)CH$_2$O] portion and [CH$_2$CH(CH$_2$OH)O] portion (i.e. r1=0 or s1=0 may be satisfied). The compound represented by formula (VIb) may lack one of the [CH$_2$CH(OH)CH$_2$O] portion and [CH(CH$_2$OH)CH$_2$O] portion (i.e. r2=0 or s2=0 may be satisfied). The arrangement of the structural unit in the curly brackets in formula (VIa) and formula (VIb) (that is, the [CH$_2$CH(OH)CH$_2$O] portion and [CH$_2$CH(CH$_2$OH)O] portion in formula (VIa), and the [CH$_2$CH(OH)CH$_2$O] portion and [CH(CH$_2$OH)CH$_2$O] portion in formula (VIb)) may be as desired.

From the viewpoint of increasing the polishing rate for insulating materials, n is 2 or greater. From the viewpoint of production, n is preferably 100 or less, more preferably 50 or less and even more preferably 30 or less.

From the viewpoint of further increasing the polishing rate for insulating materials, p in formula (III) is preferably 2 or greater and more preferably 5 or greater. From the viewpoint of further increasing the polishing rate for insulating materials, p is preferably 200 or less, more preferably 150 or less, even more preferably 100 or less and especially preferably 50 or less. From the viewpoint of further increasing the polishing rate for insulating materials, q in formula (IV) is preferably 2 or greater and more preferably 5 or greater. From the viewpoint of further increasing the polishing rate for insulating materials, q is preferably 200 or less, more preferably 150 or less, even more preferably 100 or less and especially preferably 50 or less.

A second aspect of the glycerin compound is the aspect wherein the glycerin compound is at least one selected from the group consisting of polyglycerin, diglycerin derivatives and polyglycerin derivatives, and the HLB value of the glycerin compound is 19.8 to 20.0. The second aspect of the glycerin compound may be the compound which is the first aspect of the glycerin compound.

Polyglycerin is a polyglycerin with a glycerin mean polymerization degree of 3 or greater (polyglycerin that is a trimer or more). The lower limit for the mean polymerization degree of the polyglycerin is 3 or greater, preferably 4 or greater, more preferably 5 or greater and even more preferably 10 or greater, from the viewpoint of increasing the polishing rate for insulating materials. There are no particular restrictions on the upper limit for the mean polymerization degree of the polyglycerin, but from the viewpoint of production, it is preferably 100 or less, more preferably 50 or less and even more preferably 30 or less. From these viewpoints, the mean polymerization degree of the polyglycerin is more preferably 3 or greater and 100 or less.

A diglycerin derivative is a compound having a functional group introduced into diglycerin. The functional group may be a polyoxyalkylene group or the like. The diglycerin derivative may be a polyoxyalkylene diglyceryl ether or the like.

Polyoxyalkylene diglyceryl ether may be polyoxyethylene diglyceryl ether (for example, SC-E Series by Sakamoto Yakuhin Kogyo Co., Ltd.) and polyoxypropylene diglyceryl ether (for example, SY-DP Series by Sakamoto Yakuhin Kogyo Co., Ltd.) or the like.

A polyglycerin derivative is a compound having a functional group introduced into polyglycerin having a mean glycerin polymerization degree of 3 or greater. The functional group may be polyoxyalkylene group or the like. The polyglycerin derivative may be polyoxyalkylene polyglyceryl ether or the like. The polyoxyalkylene polyglyceryl ether may be polyoxyethylene polyglyceryl ether, polyoxypropylene polyglyceryl ether or the like.

The ULB value for the second aspect of the glycerin compound is 19.8 or greater and preferably 19.9 or greater, from the viewpoint of excellent dispersion stability. The HLB value for the second aspect of the glycerin compound is 20.0 or less, from the viewpoint of excellent polishing selectivity for insulating materials with respect to stopper materials. The ULB value for the second aspect of the glycerin compound is more preferably 20.0, from the viewpoint of more excellent polishing selectivity for insulating materials with respect to stopper materials.

The "HLB value" is a value representing the hydrophilic/lipophilic balance of a compound. The HLB value can be determined by calculation even when the type of hydrophobic group, the type of hydrophilic group, the copolymerization ratio or the like are different in a single compound.

Several methods have been proposed for calculating the HLB value. For example, the HLB value is calculated by the Griffin method, represented by the following formula.

HLB value=20×(total molecular weight of hydrophilic portion)/(entire molecular weight)

An example of hydrophilic group includes hydroxyl group, glyceryl group, oxyethylene group, oxypropylene group, hydroxypropyl group, carboxyl group and sulfonic acid group. For example, the compound represented by formula (II) has an R$^1$ group, an OR$^2$ group and an OC$_3$H$_5$OR$^3$ group. R$^1$, R$^2$ and R$^3$ are all hydrophilic groups, and the OR$^2$ group and OC$_3$H$_5$OR$^3$ group are hydrophilic group portions. Thus, the HLB value of a compound represented by formula (II) is calculated to be about 20.0.

A glycerin compound may not be a single molecule, or it may have some extent of molecular weight distribution. The HLB value of a glycerin compound can be obtained using the average of measured values obtained by measurement according to the following method.

The HLB value of a glycerin compound in a polishing agent can be determined by separation of the glycerin compound from the polishing agent using centrifugation, chromatography, filtration, distillation or the like, followed by concentration or the like if necessary, and identification of the structure of the compound using $^{13}$C-NMR, $^1$H-NMR, GPC, MALDI-MS (Matrix Assisted Laser Desorption/Ionization-Mass Spectrometry) or the like. For example, the proportion of structural units or the like can be determined from the $^1$H-NMR spectrum. Also, the proportion of structural units and the terminal structure can be identified from the MALDI-MS spectrum. In addition, the copolymerization form of the structural units or the like can be analyzed from the $^{13}$C-NMR spectrum.

The first additive used may be a single type or a combination of two or more types, for the purpose of adjusting the polishing selectivity for insulating materials with respect to stopper materials, the flatness, the insulating material polishing rate and the like. In addition, a plurality of compounds with different polymerization degrees may be used in combination.

The upper limit for the weight-average molecular weight of the first additive is not particularly restricted, but from the viewpoint of workability and foamability, it is preferably $10 \times 10^3$ or less, more preferably $5.0 \times 10^3$ or less, even more preferably $3.0 \times 10^3$ or less and especially preferably $2.0 \times 10^3$ or less. When the first additive is a polyglycerin derivative or diglycerin derivative, the weight-average molecular weight of the first additive is more preferably $5.0 \times 10^3$ or less, even more preferably $3.0 \times 10^3$ or less and especially preferably $2.0 \times 10^3$ or less, from the viewpoint of avoiding reduced polishing rate due to overly excessive molecular weight of the functional groups in the derivative. The lower limit for the weight-average molecular weight of the first additive is preferably 250 or greater, more preferably 400 or greater and even more preferably 500 or greater, from the viewpoint of further increasing the polishing rate for insulating materials. When the first additive is polyglycerin, it is preferably 250 or greater, more preferably 400 or greater, even more preferably 500 or greater, especially preferably 750 or greater, very preferably $1.0 \times 10^3$ or greater and extremely preferably $1.2 \times 10^3$ or greater, from the viewpoint of further increasing the polishing rate for insulating materials. From these viewpoints, the weight-average molecular weight of the first additive is more preferably 250 or greater and $10 \times 10^3$ or less.

The weight-average molecular weight of the first additive can be measured by gel permeation chromatography (GPC) under the following conditions, using a standard polystyrene calibration curve, for example.

Device: Hitachi Model L-6000 [product of Hitachi, Ltd.]
Column: GL-R420 Gel pack+GL-R430 Gel pack+GL-R440 Gel pack (total of 3, trade name of Hitachi Chemical Co., Ltd.)
Eluent: Tetrahydrofuran
Measuring temperature: 40° C.
Flow rate: 1.75 mL/min
Detector: L-3300RI [Hitachi, Ltd.]

From the viewpoint of further increasing the polishing rate for insulating materials, the lower limit for the first additive content is preferably 0.01 mass % or greater, more preferably 0.04 mass % or greater, even more preferably 0.1 mass % or greater and especially preferably 0.3 mass % or greater, based on the total mass of the polishing agent. From the viewpoint of inhibiting excessive increase in the viscosity of the polishing agent, the upper limit for the first additive content is preferably 10 mass % or less and more preferably 5 mass % or less, based on the total mass of the polishing agent. From these viewpoints, the first additive content is more preferably 0.01 mass % or greater and 10 mass % or less, based on the total mass of the polishing agent. When a plurality of compounds is to be used as the first additive, the total content of each of the compounds preferably satisfies the range specified above.

[Second Additive]

The polishing agent of this embodiment may further comprise a second additive, in addition to the first additive, in order to modify the polishing properties such as polishing rate; the polishing agent properties such as abrasive grain dispersibility and storage stability; and the like.

The second additive may be a carboxylic acid, amino acid or the like. The second additive may be used as a single type alone or as a combination of two or more types. Preferred among these for the second additive are carboxylic acids and amino acids, from the viewpoint of excellent balance between abrasive grain dispersibility and polishing properties.

A carboxylic acid has an effect of stabilizing the pH while further increasing the polishing rate for insulating materials. An example of the carboxylic acid includes formic acid, acetic acid, propionic acid, butyric acid, valeric acid, caproic acid and lactic acid.

An amino acid has an effect of improving the dispersibility of the abrasive grains containing the hydroxide of a tetravalent metal element, and further increasing the polishing rate for insulating materials. An example of the amino acid includes arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine and isoleucine. An amino acid has a carboxyl group, but it is defined as one different from a carboxylic acid.

When a second additive is used, the content of the second additive is preferably 0.01 mass % or greater and 10 mass % or less, based on the total mass of the polishing agent, from the viewpoint of obtaining the effects of adding the additives while minimizing sedimentation of the abrasive grains. When a plurality of compounds is to be used as the second additive, the total content of each of the compounds preferably satisfies the range specified above.

(Water-Soluble Polymer)

The polishing agent of this embodiment may comprise a water-soluble polymer, for the purpose of adjusting the polishing properties such as flatness, in-plane uniformity, polishing selectivity for silicon oxide with respect to silicon nitride (polishing rate for silicon oxide/polishing rate for silicon nitride), and polishing selectivity for silicon oxide with respect to polysilicon (polishing rate for silicon oxide/polishing rate for polysilicon). A "water-soluble polymer" is defined as a polymer dissolved to at least 0.1 g in 100 g of water. The first additive is not included in the term "water-soluble polymer".

There are no particular restrictions on the water-soluble polymer. Specific example of the water-soluble polymers includes polysaccharides such as alginic acid, pectic acid, carboxymethyl cellulose, agar, curdlan, dextrin, cyclodextrin, chitosan, chitosan derivatives and pullulan; vinyl-based polymers such as polyvinyl alcohol, polyvinylpyrrolidone and polyacrolein; acrylic polymers such as polyacrylamide and polydimethylacrylamide; amine polymers such as polyallylamine, polyethyleneimine and polydiallylamines; and polyethylene glycol, polyoxypropylene, polyoxyethylene-polyoxypropylene condensation products, ethylenediamine polyoxyethylene-polyoxypropylene block copolymers, and the like. These water-soluble polymers may also be derivatives. Of these water-soluble polymers, amine polymers and their derivatives are preferred and polyallylamines and their derivatives are more preferred, from the viewpoint of further improving polishing selectivity for insulating materials with respect to stopper materials. The water-soluble polymer may be used as a single type alone or as a combination of two or more types.

The weight-average molecular weight of the water-soluble polymer is preferably 100 or greater, more preferably 300 or greater, even more preferably 500 or greater and especially preferably $1.0 \times 10^3$ or greater, from the viewpoint of further improving the polishing selectivity for insulating materials with respect to stopper materials. The weight-average molecular weight of the water-soluble polymer is preferably $300 \times 10^3$ or less, more preferably $100 \times 10^3$ or less, even more preferably $50 \times 10^3$ or less and especially preferably $30 \times 10^3$ or less, from the viewpoint of further improving the polishing selectivity for insulating materials with respect to stopper materials. From these viewpoints, the weight-average molecular weight of the water-soluble polymer is more preferably 100 or greater and $300 \times 10^3$ or less. The weight-average molecular weight of the water-soluble polymer can be measured by the same method as for the weight-average molecular weight of the first additive.

When a water-soluble polymer is used, the content of the water-soluble polymer is preferably 0.0001 mass % or greater, more preferably 0.00015 mass % or greater and even more preferably 0.0002 mass % or greater, based on the total mass of the polishing agent, from the viewpoint of obtaining the effect of adding the water-soluble polymer while minimizing sedimentation of the abrasive grains. The content of the water-soluble polymer is preferably 5 mass % or less, more preferably 3 mass % or less and even more preferably 1 mass % or less, based on the total mass of the polishing agent, from the viewpoint of obtaining the effect of adding the water-soluble polymer while minimizing sedimentation of the abrasive grains. From these viewpoints, the content of the water-soluble polymer is more preferably 0.0001 mass % or greater and 5 mass % or less. When a plurality of compounds is to be used as the water-soluble polymer, the total content of each of the compounds preferably satisfies the range specified above.

(Polishing Agent Properties)

The lower limit for the pH (25° C.) of the polishing agent of this embodiment is preferably 3.0 or greater, more preferably 4.0 or greater, even more preferably 4.5 or greater and especially preferably 5.0 or greater, from the viewpoint of further increasing the polishing rate for insulating materials. Also, the upper limit for the pH is preferably 12.0 or less, more preferably 11.0 or less, even more preferably 10.0 or less, especially preferably 9.0 or less and extremely preferably 8.0 or less, from the viewpoint of further increasing the polishing rate for insulating materials. From these viewpoints, the pH of the polishing agent is more preferably 3.0 or greater and 12.0 or less.

The pH of the polishing agent can be adjusted with an acid component such as an inorganic acid or organic acid; an alkaline component such as ammonia, sodium hydroxide, tetramethylammonium hydroxide (TMAH) or imidazole; or the like. A buffering agent may also be added to stabilize the pH. A buffering agent may also be added using a buffer solution (a buffering agent-containing solution). An example of such buffer solutions includes acetate buffer solutions and phthalate buffer solutions.

The pH of the polishing agent of this embodiment can be measured with a pH meter (for example, a Model PHL-40 by DKK Corp.). Specifically, for example, after 2-point calibration of a pH meter using phthalate pH buffer solution (pH 4.01) and a neutral phosphate pH buffer solution (pH 6.86) as standard buffer solutions, the pH meter electrode was placed in the polishing agent, and then the value was measured after at least 2 minutes passed for stabilization. Here, the liquid temperature of the standard buffer solution and polishing agent are both 25° C.

The polishing agent of this embodiment may be stored as a one-pack polishing agent containing at least the abrasive grains, the first additive and water, or it may be stored as a multi-pack (for example, two-pack) polishing agent set comprising constituent components divided into a slurry (first liquid) and an additive solution (second liquid) so that the slurry and additive solution are mixed to form the polishing agent. The slurry contains at least the abrasive grains and water, for example. The additive solution contains the first additive and water, for example. Between the slurry and the additive solution, the first additive, second additive, water-soluble polymer and buffering agent are preferably contained in the additive solution. The constituent components of the polishing agent may be stored as a polishing agent set divided into three or more liquids.

In such a polishing agent set, the slurry and the additive solution are mixed immediately before polishing or during polishing to prepare the polishing agent. Also, a one-pack polishing agent may be stored as a polishing agent storage solution with a reduced water content, and used by dilution with water at the time of polishing. A multi-pack polishing agent set may be stored as a slurry storage solution and additive solution storage solution with reduced water contents, and used by dilution with water at the time of polishing.

In the case of a one-pack polishing agent, the method used to supply the polishing agent onto the polishing platen may be a method of supplying the polishing agent by direct liquid conveyance; a method of separately conveying the polishing agent storage solution and water through tubings, merging them together and then supplying; or a method of mixing the polishing agent storage solution and water beforehand and then supplying.

For storage as a multi-pack polishing agent set separately comprising a slurry and additive solution, the polishing rate can be adjusted by optionally varying the composition of these liquids. When a polishing agent set is used for polishing, the following method may be used as the method for supplying the polishing agent onto the polishing platen. For example, there may be employed a method of separately conveying the slurry and additive solution through tubings and merging the tubings to mix and then supplying; a method of separately conveying the slurry storage solution, additive solution storage solution and water through tubings and merging the tubings to mix and then supplying; a method of mixing the slurry and additive solution beforehand and then supplying; or a method of mixing the slurry storage solution, additive solution storage solution and water beforehand and then supplying. There may also be employed a method in which the slurry and additive solution of the polishing agent set are each supplied onto the polishing platen. In this case, the polishing agent obtained by mixing the slurry and additive solution on the polishing platen are used for polishing of the surface to be polished.

(Polishing Method for Base Substrate)

The polishing method for a base substrate of this embodiment may comprise a polishing step of polishing the surface to be polished of a base substrate using the one-pack polishing agent, or it may comprise a polishing step of polishing the surface to be polished of a base substrate using the polishing agent obtained by mixing the slurry and the additive solution of the polishing agent set. Also, the polishing method for a base substrate of this embodiment may be a polishing method for a base substrate having an insulating material and polysilicon, and for example, it may comprise a polishing step of selectively polishing the insulating material with respect to the polysilicon using the one-pack polishing agent, or the polishing agent obtained by mixing the slurry and the additive solution of the polishing agent set. In this case, the base substrate may have a member comprising the insulating material and a member comprising the polysilicon, for example. "Selectively polish material A with respect to material B" means that the polishing rate for material A is higher than the polishing rate for material B under the same polishing conditions. More specifically, it means, for example, that material A is polished with the polishing rate ratio of the polishing rate for material A with respect to the polishing rate for material B being 10 or greater.

In the polishing step, for example, under the condition that the material to be polished of the base substrate that has the material to be polished is pressed against the abrasive pad (abrasive cloth) of a polishing platen, the polishing agent is supplied between the material to be polished and the abrasive pad, and the base substrate and polishing platen are moved relative to each other to polish the surface to be polished of the material to be polished. For example, at least a portion of the material to be polished is removed by the polishing in the polishing step.

The base substrate that is to be polished may be a substrate or the like, and for example, it may be a substrate comprising a material to be polished formed on a substrate for semiconductor element production (for example, a semiconductor substrate in which an STI pattern, gate pattern or wiring pattern has been formed). An example of the material to be polished includes an insulating material such as silicon oxide; a stopper material such as polysilicon and silicon nitride. The material to be polished may be a single material or a plurality of materials. When a plurality of materials is exposed on the surface to be polished, they may be considered as the material to be polished. The material to be polished may be in the form of a film, such as a silicon oxide film, polysilicon film and silicon nitride film.

By polishing a material to be polished (for example, an insulating material such as silicon oxide) formed on such substrate with the polishing agent and removing the unwanted sections, it is possible to eliminate irregularities on the surface of the material to be polished and to produce a smooth surface over the entire surface of the material to be polished. The polishing agent of this embodiment is preferably used for polishing of a surface to be polished containing silicon oxide.

In this embodiment, it is possible to polish an insulating material of a base substrate having an insulating material containing silicon oxide on at least the surface, a stopper (polishing stop layer) disposed as the lower layer of the insulating material, and a semiconductor substrate disposed under the stopper. The stopper material composing the stopper is a material with a lower polishing rate than the insulating material, and it is preferably polysilicon, silicon nitride or the like. With such a substrate, excessive polishing of the insulating material is prevented by stopping the polishing when the stopper have exposed, and this can improve flatness of the insulating material after polishing.

An example of the forming method for a material to be polished by the polishing agent of this embodiment includes a CVD method such as low-pressure CVD method, normal-pressure CVD method and plasma CVD method; a spin coating method in which the liquid material is coated onto the substrate that is spinning.

Silicon oxide is obtained using low-pressure CVD method, for example, by thermal reaction of monosilane ($SiH_4$) and oxygen ($O_2$). Silicon oxide is also obtained using normal-pressure CVD method, for example, by thermal reaction of tetraethoxysilane ($Si(OC_2H_5)_4$) and ozone ($O_3$). As another example, silicon oxide is likewise obtained by plasma reaction of tetraethoxysilane and oxygen.

Silicon oxide is obtained using a spin coating method, for example, by coating a liquid starting material containing inorganic polysilazane, inorganic siloxane or the like onto a substrate and conducting thermosetting reaction in a furnace body or the like.

An example of the forming method for polysilicon includes low-pressure CVD method in which monosilane is subjected to thermal reaction, and plasma CVD method in which monosilane is subjected to plasma reaction.

Example of the forming method for silicon nitride includes low-pressure CVD method in which dichlorsilane and ammonia are thermally reacted, and plasma CVD method in which monosilane, ammonia and nitrogen are subjected to plasma reaction. The silicon nitride obtained by such a method may contain elements other than silicon and nitrogen, such as carbon or hydrogen, in order to adjust the material quality.

In order to stabilize the materials such as silicon oxide, polysilicon and silicon nitride that are obtained by such methods, heat treatment may be carried out at a temperature of 200° C. to 1000° C. as necessary. The silicon oxide obtained by such methods may also contain small amounts of boron (B), phosphorus (P), carbon (C) or the like in order to increase the embedding property.

The polishing method of this embodiment will now be explained using a polishing method for a semiconductor substrate on which an insulating material has been formed, as an example. In the polishing method of this embodiment, the polishing apparatus used may be a common polishing apparatus having a holder capable of holding the base substrate, such as a semiconductor substrate, that has the surface to be polished, and a polishing platen on which an abrasive pad can be mounted. Rotational speed-variable motors or the like may be mounted on the holder and the polishing platen, respectively. An example of the polishing apparatus includes the polishing apparatus: Reflexion by Applied Materials, Inc.

The abrasive pad used may be a common nonwoven fabric, foam body, non-foam body or the like. The abrasive pad material used may be a resin such as polyurethane, acryl, polyester, acryl-ester copolymer, polytetrafluoroethylene, polypropylene, polyethylene, poly-4-methylpentene, cellulose, cellulose ester, polyamide (for example, nylon (trademark) and aramid), polyimide, polyimideamide, polysiloxane copolymer, oxirane compound, phenol resin, polystyrene, polycarbonate, epoxy resin and the like. Especially, the abrasive pad material is preferably polyurethane foam and non-foam polyurethane, from the viewpoint of polishing rate and flatness. The abrasive pad is preferably furrowed to allow accumulation of the polishing agent.

There are no particular restrictions on the polishing conditions, but the rotational speed of the polishing platen is preferably 200 $min^{-1}$ or less so that the semiconductor substrate does not fly out, the polishing pressure (machining load) on the semiconductor substrate is preferably 100 kPa or less from the viewpoint of adequately inhibiting the generation of polishing scratches. The polishing agent is preferably continuously supplied to the abrasive pad with a pump or the like during polishing. The amount supplied is not particularly restricted, but preferably the surface of the abrasive pad is covered by the polishing agent at all times.

The semiconductor substrate after polishing is preferably thoroughly cleaned in flowing water to remove the particles adhering to the substrate. The cleaning may be carried out using dilute hydrofluoric acid or ammonia water in addition to purified water, and a brush may be used together to increase the cleaning efficiency. Also, it is preferred that, after cleaning, the water droplets adhering to the semiconductor substrate are removed off using a spin dryer or the like, and then the semiconductor substrate is dried.

The polishing agent, polishing agent set and polishing method of this embodiment can be suitably employed for formation of an STI. For formation of an STI, the polishing rate ratio for the insulating material (for example, silicon oxide) with respect to the stopper material (for example, polysilicon) is preferably 10 or greater and more preferably 12 or greater. If the polishing rate ratio is lower than 10, the magnitude of the polishing rate for the insulating material with respect to the polishing rate for the stopper material is small, and therefore, it will tend to be difficult to halt polishing at the prescribed location during formation of the STI. If the polishing rate ratio is 10 or greater, on the other hand, it will be easier to halt polishing, which is more suitable for STI formation.

The polishing agent, polishing agent set and polishing method of this embodiment can also be employed for polishing of pre-metal insulating materials. Examples of pre-metal insulating materials include, in addition to silicon oxide, also phosphorus-silicate glass and boron-phosphorus-silicate glass, as well as silicon oxyfluoride and fluorinated amorphous carbon.

The polishing agent, polishing agent set and polishing method of this embodiment can also be employed for materials other than insulating materials such as silicon oxide. An Example of such material includes high permittivity materials such as Hf-based, Ti-based and Ta-based oxides; semiconductor materials such as silicon, amorphous silicon, SiC, SiGe, Ge, GaN, GaP, GaAs and organic semiconductors; phase-change materials such as GeSbTe; inorganic conductive materials such as ITO; and polymer resin materials such as polyimide-based, polybenzooxazole-based, acrylic, epoxy-based and phenol-based materials.

The polishing agent, polishing agent set and polishing method of this embodiment can be employed not only for polishing of film-like materials, but also for various types of substrates made of glass, silicon, SiC, SiGe, Ge, GaN, GaP, GaAs, sapphire or plastics.

The polishing agent, polishing agent set and polishing method of this embodiment can be employed not only for production of semiconductor elements, but also for production of image display devices such as TFTs and organic ELs; optical parts such as photomasks, lenses, prisms, optical fibers and single crystal scintillators; optical elements such as optical switching elements and optical waveguides; light-emitting elements such as solid lasers and blue laser LEDs; and magnetic storage devices such as magnetic disks and magnetic heads.

EXAMPLES

The present invention will now be explained in detail by examples, with the understanding that the invention is not limited to the examples.

<Synthesis of Hydroxide of a Tetravalent Metal Element>
175 g of $Ce(NH_4)_2(NO_3)_6$ was dissolved in 8000 g of purified water to obtain a solution. Next, while stirring the solution, 750 g of an aqueous imidazole solution (10 mass % aqueous solution, 1.47 mol/L) was added dropwise at a mixing rate of 5 mL/min to obtain a dispersion (yellowish white) containing 29 g of particles of hydroxide of cerium. The particles of hydroxide of cerium were synthesized at a temperature of 25° C. and a stirring speed of 400 $min^{-1}$. The stirring was carried out using a 3-blade pitch paddle with a total blade section length of 5 cm.

The obtained dispersion of particles of hydroxide of cerium was subjected to solid-liquid separation by centrifugal separation (4000 $min^{-1}$, 5 minutes), and a precipitate at a solid content of approximately 10% was taken out. Water was mixed with the precipitate obtained by solid-liquid separation so that a cerium hydroxide content was adjusted to 1.0 mass %, and an ultrasonic cleaner was used to disperse the particles in the water to prepare a cerium hydroxide slurry storage solution.

<Measurement of Mean Particle Diameter>
Upon measurement of the mean particle diameter of the particles of hydroxide of cerium in the cerium hydroxide slurry storage solution using an N5, trade name of Beckman Coulter, Inc., a value of 25 nm was obtained. The measuring method was as follows. First, approximately 1 mL of measuring sample (aqueous dispersion) containing 1.0 mass % of particles of hydroxide of cerium was placed in a 1 cm-square cell, and the cell was set in the N5. Measurement was performed at 25° C. with the refractive index of the measuring sample adjusted to 1.333 and the viscosity of the measuring sample adjusted to 0.887 mPa·s, and the value indicated as Unimodal Size Mean was read off.

<Structural Analysis of Abrasive Grains>
A suitable amount of the cerium hydroxide slurry storage solution was taken and vacuum dried to isolate the abrasive grains, and then thoroughly washed with purified water to obtain a sample. The obtained sample was measured by FT-IR ATR, and a peak for nitrate ion ($NO_3^-$) was observed in addition to a peak for hydroxide ion ($OH^-$). The same sample was measured by XPS(N—XPS) for nitrogen, and a peak for nitrate ion was observed while no peak for $NH_4^+$ was observed. These results confirmed that the abrasive grains in the cerium hydroxide slurry storage solution at least partially contain particles having nitrate ion bonded to cerium element. Also, since it also at least partially contains particles having hydroxide ion bonded to cerium element, this confirmed that the abrasive grains contained hydroxide of cerium.

<Measurement of Absorbance and Light Transmittance>
A suitable amount of cerium hydroxide slurry storage solution was taken and diluted with water so that an abrasive grain content was adjusted to 0.0065 mass % (65 ppm), to obtain a measuring sample (aqueous dispersion). Approximately 4 mL of this measuring sample was placed in a 1 cm-square cell, and the cell was set in a spectrophotometer (apparatus name: U3310) by Hitachi, Ltd. Spectrophotometry was performed in a wavelength range of 200 to 600 nm to measure the absorbance for light with a wavelength of 290 nm and absorbance for light with a wavelength of 450 to 600 nm. The absorbance for light with a wavelength of 290 nm was 1.192, and the absorbance for light with a wavelength of 450 to 600 nm was less than 0.010.

Approximately 4 mL of the cerium hydroxide slurry storage solution (particle content: 1.0 mass %) was placed in a 1 cm-square cell, and the cell was set in a spectrophotometer (apparatus name: U3310) by Hitachi, Ltd. Spectrophotometry was performed in a wavelength range of 200 to 600 nm to measure the absorbance for light with a wavelength of 400 nm and the light transmittance for light with a wavelength of 500 nm. The absorbance for light with a wavelength of 400 nm was 2.25, and the light transmittance for light with a wavelength of 500 nm was 92%/cm.

<Preparation of CMP Polishing Agent>
The CMP polishing agents used in Examples 1 to 8 and Comparative Examples 1 to 7 were prepared so as to comprise 0.05 mass % of particles of hydroxide of cerium as the abrasive grains, 0 to 0.5 mass % of the additives listed in Table 1, 0.005 mass % of imidazole as a pH regulator and purified water as the remainder, based on the total mass of the CMP polishing agent. After dissolving the components other than the abrasive grains in the purified water, the cerium hydroxide slurry storage solution was mixed and stirred to prepare a CMP polishing agent.

The additives used in the examples were compounds having the following structures.

Polyglycerin tetramer: Compound satisfying the formula (I) (m=4)

Polyglycerin hexamer: Compound satisfying the formula (I) (m=6)

Polyglycerin decamer: Compound satisfying the formula (I) (m=10)

Polyglycerin icosamer: Compound satisfying the formula (I) (m=20)

SC-E450 (diglycerin polyether (polyoxyethylene diglyceryl ether) by Sakamoto Yakuhin Kogyo Co., Ltd., compound satisfying the formula (II) ($R^1$: group represented by the formula (III), $R^2$: hydrogen atom, $R^3$: hydrogen atom, n=2, p=6)

SC-E2000 (diglycerin polyether (polyoxyethylene diglyceryl ether) by Sakamoto Yakuhin Kogyo Co., Ltd., compound satisfying the formula (II) ($R^1$: group represented by the formula (III), $R^2$: hydrogen atom, $R^3$: hydrogen atom, n=2, p=40)

SC-E4500 (diglycerin polyether (polyoxyethylene diglyceryl ether) by Sakamoto Yakuhin Kogyo Co., Ltd., compound satisfying the formula (II) ($R^1$: group represented by the formula (III), $R^2$: hydrogen atom, $R^3$: hydrogen atom, n=2, p=90)

<Evaluation of Liquid Properties>

The pH of the CMP polishing agent and the mean particle diameter of the particles of hydroxide of cerium in the CMP polishing agent were evaluated under the following conditions. For Examples 1 to 8 and Comparative Examples 1 to 7, the pH of the CMP polishing agent was 6.5 and the mean particle diameter of the particles of hydroxide of cerium was 25 nm.

(pH)

Measuring temperature: 25±5° C.

Measuring apparatus: Model PHL-40 by DKK Corp.

Measuring method: After 2-point calibration using standard buffer solution (phthalate pH buffer solution: pH: 4.01 (25° C.), neutral phosphate pH buffer solution: pH 6.86 (25° C.)), the electrode was placed in the CMP polishing agent, and then the pH was measured with the measuring apparatus described above after at least 2 minutes passed for stabilization.

(Mean Particle Diameter of Particles of Hydroxide of Cerium)

The mean particle diameter of the particles of hydroxide of cerium in the CMP polishing agent was measured using an N5, trade name of Beckman Coulter, Inc. The measuring method was as follows. First, approximately 1 μL of the CMP polishing agent was placed in a 1 cm-square cell and the cell was set in the N5. Measurement was performed at 25° C. with the refractive index of the measuring sample adjusted to 1.333 and the viscosity of the measuring sample adjusted to 0.887 mPa·s, and the value indicated as Unimodal Size Mean was read off.

<CMP Polishing Conditions>

The CMP polishing agent was used for polishing of substrates to be polished, under the following polishing conditions. A substrate having a polysilicon film was polished in each of Examples 1 to 8 and Comparative Examples 1 and 7. In each of Comparative Examples 2 to 6, the substrate having a polysilicon film was not polished due to the low silicon oxide film polishing rate.

(Polishing Conditions)

Polishing apparatus: Reflexion (Applied Materials, Inc.)

CMP polishing agent flow rate: 200 mL/min

Substrates to be polished: A substrate having a 1 μm-thick silicon oxide film formed on a silicon substrate by plasma CVD method, and a substrate having a 0.2 μm-thick polysilicon film formed on a silicon substrate by CVD method.

Abrasive pad: Foamed polyurethane resin with closed cells (Model IC 1000, Rohm & Haas, Japan).

Polishing pressure: 14.7 kPa (2 psi)

Relative speed between substrate and polishing platen: 85 m/min

Polishing time: 1 minute

Cleaning: CMP treatment was followed by cleaning with ultrasonic water and drying with a spin dryer.

<Evaluation of Polished Products>

The polishing rates for films to be polished (silicon oxide film and polysilicon film) that had been polished and cleaned under the conditions described above (silicon oxide polishing rate: $SiO_2RR$, polysilicon polishing rate: p-SiRR) were determined by the following formula. The difference in film thickness of the film to be polished before and after polishing was determined using a light-interference film thickness meter (trade name: F80 by Filmetrics Japan, Inc.).

(Polishing rate: RR)=(Film thickness difference of film to be polished before and after polishing (nm))/polishing time (min))

Also, a polished substrate (blanket wafer substrate having a silicon oxide film) that had been polished and cleaned under the conditions described above was dipped for 15 seconds in an aqueous solution of 0.5 mass % hydrogen fluoride and washed with water for 60 seconds. Next, the surface of the polished film was cleaned for 1 minute using a polyvinyl alcohol brush while supplying water, and was dried. Complus by Applied Materials, Inc. was used to detect defects of 0.2 μm or greater on the surface of the polished film. Also, upon observation of the surface of the polished film using the defect detection coordinates obtained by the Complus, and using an SEM Vision by Applied Materials, Inc., the number of polishing scratches of 0.2 μm or greater at the surface of the polished film was about 0 to 3 (per wafer) in both the examples and the comparative examples, indicating that generation of polishing scratches was adequately inhibited.

Table 1 shows the silicon oxide polishing rate ($SiO_2RR$), the polysilicon polishing rate (p-SiRR), the polishing selectivity ratio, i.e. silicon oxide polishing rate/polysilicon polishing rate, and the like, for Examples 1 to 8 and Comparative Examples 1 to 7. The HLB value of the additives of Examples 1 to 8 was 20.0. The polyglycerol fatty acid ester of Comparative Example 7 (polyglycerin mean polymerization degree: 4, the HLB value: 12.2) is not a compound represented by formula (I) or (II), since it is a fatty acid ester.

TABLE 1

| | Additive (mass %) | Weight-average molecular weight | $SiO_2RR$ (nm/min) | p-SiRR (nm/min) | Polishing selectivity ratio ($SiO_2RR$/p-SiRR) |
| --- | --- | --- | --- | --- | --- |
| Example 1 | Polyglycerin tetramer (0.5) | 300 | 200 | 19 | 11 |
| Example 2 | Polyglycerin hexamer (0.5) | 420 | 225 | 21 | 11 |
| Example 3 | Polyglycerin decamer (0.5) | 680 | 280 | 24 | 12 |
| Example 4 | Polyglycerin icosamer (0.5) | 1300 | 315 | 22 | 14 |
| Example 5 | SC-E450 (0.5) | 450 | 230 | 17 | 14 |
| Example 6 | SC-E2000 (0.5) | 2000 | 210 | 15 | 14 |
| Example 7 | SC-E4500 (0.5) | 4500 | 195 | 16 | 12 |
| Example 8 | Polyglycerin icosamer (0.05) | 1300 | 270 | 23 | 12 |

TABLE 1-continued

| | Additive (mass %) | Weight-average molecular weight | SiO$_2$RR (nm/min) | p-SiRR (nm/min) | Polishing selectivity ratio (SiO$_2$RR/ p-SiRR) |
|---|---|---|---|---|---|
| Comparative Example 1 | None | — | 160 | 100 | 1.6 |
| Comparative Example 2 | Glycerin (0.05) | 92 | 115 | — | — |
| Comparative Example 3 | Diglycerin (0.05) | 166 | 165 | — | — |
| Comparative Example 4 | Polyvinyl alcohol (0.05) | 10000 | 180 | — | — |
| Comparative Example 5 | α-cyclodextrin (0.05) | 972 | 180 | — | — |
| Comparative Example 6 | Polyoxyethylene sorbitan monolaurate (0.05) | 346 | 130 | — | — |
| Comparative Example 7 | Polyglycerin fatty acid ester (0.05) | 492 | 162 | 23 | 7.0 |

The results shown in Table 1 will now be explained in greater detail. For preparation of the CMP polishing agent in Example 1, a polyglycerin tetramer (weight-average molecular weight: 300) was used at 0.5 mass %. For Example 1, the silicon oxide polishing rate was 200 nm/min, which was a higher value than Comparative Examples 1 to 7. Also, the polishing selectivity ratio was 11, which was a higher value than Comparative Examples 1 and 7.

For preparation of the CMP polishing agent in Example 2, a polyglycerin hexamer (weight-average molecular weight: 420) was used at 0.5 mass %. For Example 2, the silicon oxide polishing rate was 225 nm/min, which was a higher value than Comparative Examples 1 to 7. Also, the polishing selectivity ratio was 11, which was a higher value than Comparative Examples 1 and 7.

For preparation of the CMP polishing agent in Example 3, a polyglycerin decamer (weight-average molecular weight: 680) was used at 0.5 mass %. For Example 3, the silicon oxide polishing rate was 280 nm/min, which was a higher value than Comparative Examples 1 to 7. Also, the polishing selectivity ratio was 12, which was a higher value than Comparative Examples 1 and 7.

For preparation of the CMP polishing agent in Example 4, a polyglycerin icosamer (weight-average molecular weight: 1300) was used at 0.5 mass %. For Example 4, the silicon oxide polishing rate was 315 nm/min, which was a higher value than Comparative Examples 1 to 7. Also, the polishing selectivity ratio was 14, which was a higher value than Comparative Examples 1 and 7.

For preparation of the CMP polishing agent in Example 5, SC-E450 (diglycerin polyether (polyoxyethylene diglyceryl ether) by Sakamoto Yakuhin Kogyo Co., Ltd., weight-average molecular weight: 450) was used at 0.5 mass %. For Example 5, the silicon oxide polishing rate was 230 nm/min, which was a higher value than Comparative Examples 1 to 7. Also, the polishing selectivity ratio was 14, which was a higher value than Comparative Examples 1 and 7.

For preparation of the CMP polishing agent in Example 6, SC-E2000 (diglycerin polyether (polyoxyethylene diglyceryl ether) by Sakamoto Yakuhin Kogyo Co., Ltd., weight-average molecular weight: 2000) was used at 0.5 mass %. For Example 6, the silicon oxide polishing rate was 210 nm/min, which was a higher value than Comparative Examples 1 to 7. Also, the polishing selectivity ratio was 14, which was a higher value than Comparative Examples 1 and 7.

For preparation of the CMP polishing agent in Example 7, SC-E4500 (diglycerin polyether (polyoxyethylene diglyceryl ether) by Sakamoto Yakuhin Kogyo Co., Ltd., weight-average molecular weight: 4500) was used at 0.5 mass %. For Example 7, the silicon oxide polishing rate was 195 nm/min, which was a higher value than Comparative Examples 1 to 7. Also, the polishing selectivity ratio was 12, which was a higher value than Comparative Examples 1 and 7.

For preparation of the CMP polishing agent in Example 8, a polyglycerin icosamer (weight-average molecular weight: 1300) was used at 0.05 mass %. For Example 8, the silicon oxide polishing rate was 270 nm/min, which was a higher value than Comparative Examples 1 to 7. Also, the polishing selectivity ratio was 12, which was a higher value than Comparative Examples 1 and 7.

INDUSTRIAL APPLICABILITY

According to the invention, it is possible to provide a polishing agent, a polishing agent set and a polishing method that can increase the polishing rate for insulating materials and that can also improve the polishing selectivity for insulating materials with respect to stopper materials. Furthermore, according to the invention, particularly, in CMP techniques for flattening of STI insulating materials, pre-metal insulating materials, interlayer insulating materials and the like, it is possible to provide a polishing agent, a polishing agent set and a polishing method that can polish the insulating materials at high rate and that can also improve the polishing selectivity for insulating materials with respect to stopper materials. In addition, according to the invention, it is possible to allow the polishing of insulating materials with low polishing scratches while also increasing the polishing rate for insulating materials.

The invention claimed is:
1. A polishing agent comprising:
water,
an abrasive grain containing a hydroxide of a tetravalent metal element, and
a glycerin compound,
the glycerin compound being at least one compound represented by general formula (II) below:

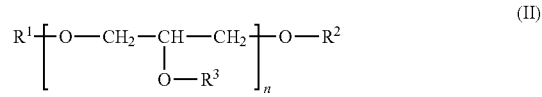

(II)

wherein, in formula (II), n represents an integer of 2 or greater, and R$^1$, R$^2$ and multiple R$^3$ each independently represent hydrogen atom, a group represented by general formula (III) below or a group represented by general formula (IV) below;
and wherein the case where R$^1$, R$^2$ and multiple R$^3$ are all hydrogen atom is excluded;

(III)

wherein, in formula (III), p represents an integer of 1 or greater

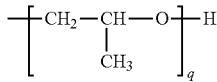

and wherein, in formula (IV), q represents an integer of 1 or greater.

2. The polishing agent according to claim 1, wherein the hydroxide of a tetravalent metal element is at least one selected from the group consisting of hydroxide of rare earth metal element and hydroxide of zirconium.

3. The polishing agent according to claim 1, wherein a mean particle diameter of the abrasive grain is 1 nm or greater and 300 nm or less.

4. The polishing agent according to claim 1, wherein a content of the abrasive grain is 0.005 mass % or greater and 20 mass % or less based on a total mass of the polishing agent.

5. The polishing agent according to claim 1, wherein a weight-average molecular weight of the glycerin compound is 250 or greater and $10 \times 10^3$ or less.

6. The polishing agent according to claim 1, wherein a content of the glycerin compound is 0.01 mass % or greater and 10 mass % or less based on a total mass of the polishing agent.

7. The polishing agent according to claim 1, wherein a pH is 3.0 or greater and 12.0 or less.

8. The polishing agent according to claim 1, used for polishing of a surface to be polished containing silicon oxide.

9. A polishing agent set comprising constituent components of the polishing agent according to claim 1 separately stored as a first liquid and a second liquid,
the first liquid containing the abrasive grain and water, and
the second liquid containing the glycerin compound and water.

10. A polishing method for a base substrate, comprising a step of polishing a surface to be polished of a base substrate using the polishing agent according to claim 1.

11. A polishing method for a base substrate, comprising a step of polishing a surface to be polished of a base substrate using a polishing agent obtained by mixing the first liquid and the second liquid of the polishing agent set according to claim 9.

12. A polishing method for a base substrate having an insulating material and polysilicon,
the polishing method comprising a step of selectively polishing the insulating material with respect to the polysilicon using the polishing agent according to claim 1.

13. A polishing method for a base substrate having an insulating material and polysilicon,
the polishing method comprising a step of selectively polishing the insulating material with respect to the polysilicon using a polishing agent obtained by mixing the first liquid and the second liquid of the polishing agent set according to claim 9.

* * * * *